United States Patent [19]

Cleavelin et al.

[11] Patent Number: 4,839,010
[45] Date of Patent: Jun. 13, 1989

[54] FORMING AN ANTIREFLECTIVE COATING FOR VLSI METALLIZATION

[75] Inventors: Cloves R. Cleavelin, Lubbock; Danny Phillips, Levelland, both of Tex.

[73] Assignee: Texas Instruments Incorporated, Dallas, Tex.

[21] Appl. No.: 928,691

[22] Filed: Nov. 6, 1986

Related U.S. Application Data

[63] Continuation of Ser. No. 771,521, Aug. 30, 1985, abandoned.

[51] Int. Cl.$^4$ ................ C23C 14/00; B05D 5/12
[52] U.S. Cl. ................ 204/192.28; 204/192.26; 437/235; 437/245; 427/126.3; 427/126.4
[58] Field of Search ............ 204/192.28, 192.26; 437/235, 245

[56] References Cited

U.S. PATENT DOCUMENTS

| | | | |
|---|---|---|---|
| 3,884,698 | 5/1975 | Kakihama | 430/317 |
| 4,307,132 | 12/1981 | Chu et al. | 427/90 |
| 4,462,884 | 7/1984 | Gillery | 204/192.28 |
| 4,490,184 | 12/1984 | Forcht et al. | 148/6.21 |

Primary Examiner—Norman Morgenstern
Assistant Examiner—Margaret Burke
Attorney, Agent, or Firm—Stanton C. Braden; James T. Comfort; Melvin Sharp

[57] ABSTRACT

Method of forming an antireflective coating on a face of a semiconductor which includes forming a metal oxide layer on the face, heating the oxide layer to a temperature sufficiently high to cause the migration of free metal atoms over the surface of the metal oxide and then sputtering a thin layer of aluminum or aluminum alloy on the oxide layer of a thickness such that bumps are formed which reduce the specularity of the surface. The aluminum atoms form bumps which reduce the specularity of the surface.

12 Claims, 2 Drawing Sheets

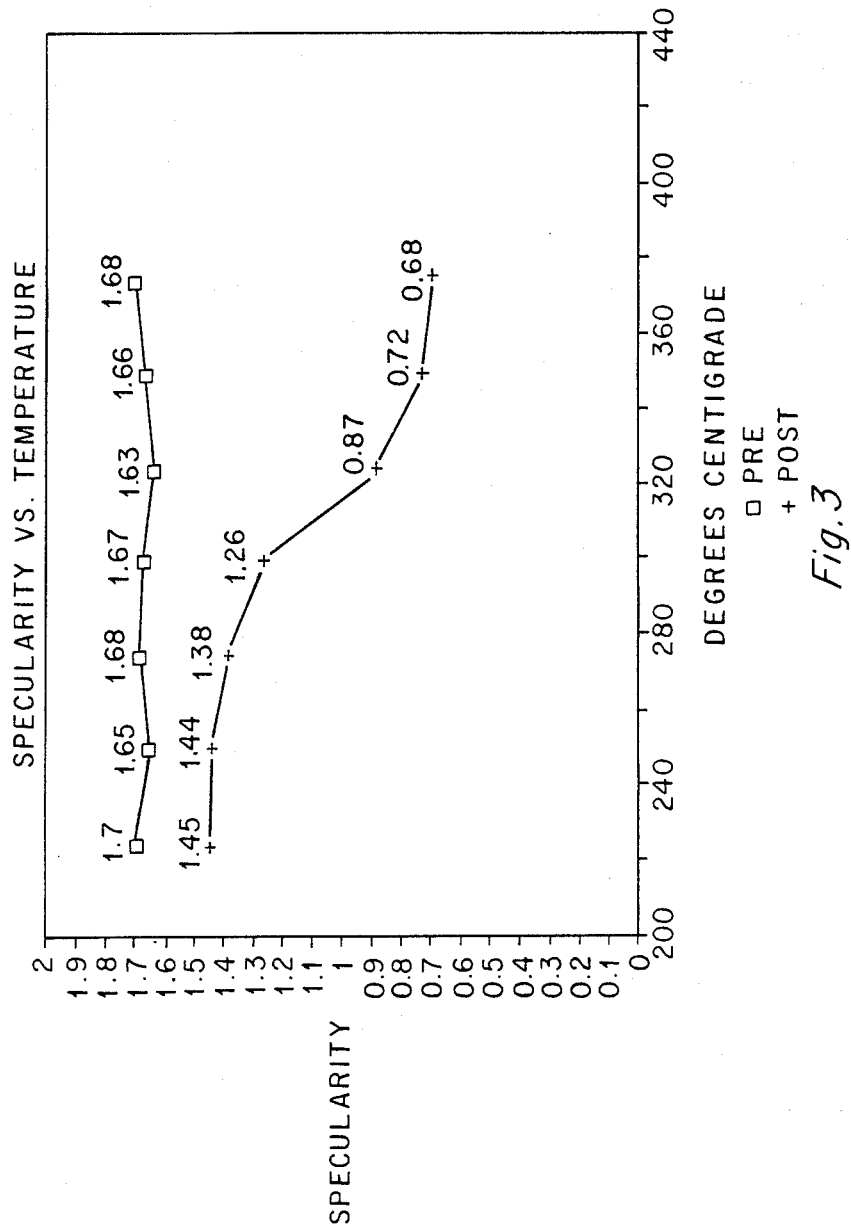

FORMING AN ANTIREFLECTIVE COATING FOR VLSI METALLIZATION

RELATED CASES

The present application is a contination of application Ser. No. 771,521 filed Aug. 30, 1985 now abandoned.

FIELD

The present invention relates to a method of reducing the specularity of highly specular surfaces in photolithographic processing of integrated circuit devices. In particular the method relates to the formation of an antireflective coating over a highly specular surface prior to the application and development of photoresist in order to reduce unwanted reflections.

BACKGROUND OF THE INVENTION

Unfortunately, the properties of an aluminum metallization layer which produce a film with desirable physical and electrical properties of resistivity uniformity of thickness grain size, etc. also produce a surface with a high specularity.

Highly specular surfaces in photolithographic processing produce unwanted reflections which can expose adjacent areas. Prior attempts to control such unwanted exposure of photoresist in adjacent geometries have included the application of antireflective coatings to the substrate surface before the depositing of photoresist. Such coatings have not generally been successful in reducing metal surface specularity to a desire extent. Another approach has been to use a dyed photoresist to absorb radiation reflected from the metal surface. The dyed photoresist, however, does not sufficiently reduce the level of unwanted reflections. A third approach has been to include an impurity atom such as oxygen in the film. Again, only limited success has been achieved using the latter technique.

It is, therefore, a principle object of the invention to provide an improved method of reducing the specularity of highly specular surfaces in the photolithographic processing of VLSI devices. It is a further object to provide a method of producing an antireflective coating on a highly specular surface prior to the application of photoresist.

SUMMARY OF THE INVENTION

According to the invention there is provided a method of forming an antireflective coating on a face of a semiconductor which includes forming a metal oxide layer on the face, heating the oxide layer to a temperature sufficiently high to cause the migration of free metal atoms over the surface of the metal oxide and then depositing a layer of metal on the oxide layer of a thickness such that bumps form which reduce the specularity of the surface.

Preferably the metal is aluminum and the thickness of the thin metal layer is less than about 3 microinches.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 3 is a graph of experimental measurement of specularity versus temperature for reflection of UV light from a metal film both before and after oxidation and sputtering.

DETAILED DESCRIPTION OF SPECIFIC EMBODIMENT

Figure 1:
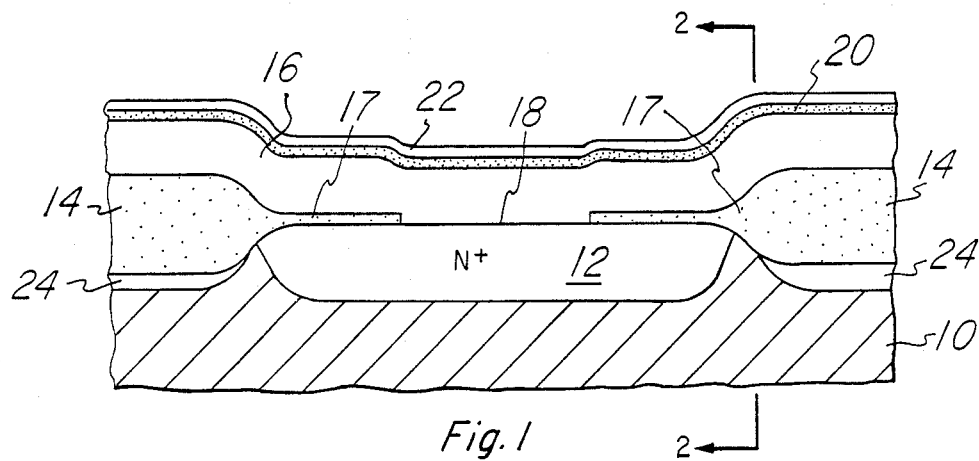
FIG. 1 is a greatly enlarged elevation view in section of a small portion of a semiconductor chip with a metallization layer made according to the invention.

Referring to FIG. 1, a typical semiconductor substrate 10 has formed at a face thereof a heavily doped N+ region 12 contained within field oxide regions 14. At the bottom of the field oxide regions 14 there are P+ channel stop regions 24. Thin oxide layers 17 on the surface of the N+ region have been etched forming hole 18 which exposes the N+ surface to an overlying layer of aluminum 16.

Prior to patterning the aluminum layer 16 the latter is exposed to either ambient conditions external to the reactor or to an oxygen ambient in order to form a native aluminum oxide layer 20. The substrate 14 is then heated to a temperature between 325 to 375 C and a second layer of aluminum 22 is sputtered over the oxide layer 20. The thickness of the second aluminum layer is less than about 3 microinches. The elevated sputtering temperature causes surface migration of the aluminum atoms over the native oxide layer 20 producing a bumpy surface with the bumps having a diameter of the order of ½ micron. The bumpy surface significantly reduces the specularity of the underlying metal film 16.

Figure 2:
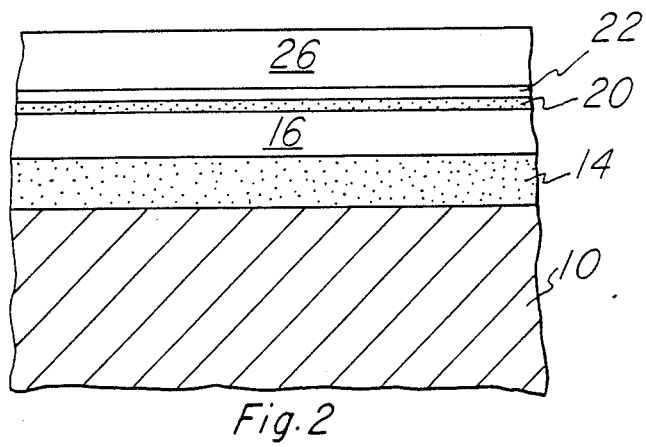
FIG. 2 is a sectional elevation view of the chip portion of FIG. 1 taken along the line 2—2.

Next, referring to FIG. 2 a layer of photoresist is deposited over the thin aluminum film 22, exposed to ultraviolet light through a mask which defines the desired pattern, and developed. Etching of the developed areas can be done using standard wet or dry chemistry etching techniques without modification for aluminum or aluminum alloys. Following etching a passivation layer normally of silicon oxide is applied over the surface of the metal.

Scanning electron microscope studies have shown that the surface texture of etched metal leads using the foregoing process are characterized by a pattern of bumps of approximately 0.5 micrometers in diameter. Probably due to the increased surface area created by these bumps and the corresponding enhanced adhesion to the passivation layer, metal leads treated in the above way exhibit a dramatic improvement in electromigration reliability. Because of the treated surface it is also expected that such treated leads will exhibit improved resistance to corrosion.

FIG. 3 shows measurements of specularity as a function of temperature of an underlying metal film before the oxidation and second sputtering process as compared to the specularity following oxidation and the second sputtering step. It will be noted that at substrate temperatures greater than 325 C the specularity reduction is greater than 50%.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed

1. A method of forming an antireflective coating on a face of a semiconductor, comprising:
   (a) forming an oxide layer of a metal on said face;
   (b) heating the metal oxide layer to an elevated temperature; and
   (c) sputtering a metal layer selected from the group consisting of aluminum alloys over said metal oxide layer of a thickness such that the sputtered metal atoms migrate over the oxide surface forming bumps which reduce the specularity of the surface of the said sputtered metal.

2. A method as in claim 1, wherein the metal deposited on said oxide layer is aluminum.

3. A method as in claim 2, wherein an underlying layer of aluminum is formed over said face and a surface thereof oxidized to form said metal oxide layer.

4. A method as in claim 3, wherein the heating step raises the temperature to be in the range of 325° C. to 375° C.

5. A method as in claim 4, wherein the thickness of said metal layer is less than about 3 microinches.

6. A method as in claim 1, wherein said metal layer sputtered on said metal oxide layer is an alloy of aluminum.

7. A method as in claim 6, wherein the thickness of the said metal layer sputtered on said metal oxide layer is less than about 3 microinches.

8. A method of forming an antireflective coating on a face of a semiconductor, comprising:
   (a) depositing a first metal layer on said face;
   (b) forming a metal oxide layer on said first metal layer;
   (c) heating the metal oxide layer to a temperature in the range of 325° C. to 375° C.; and
   (d) sputtering a second layer of metal selected from the group consisting of aluminum and aluminum alloys over the oxide layer of a sufficient thickness such that bumps are formed which reduce the specularity of a surface of the second layer.

9. A method as in claim 8, wherein said second layer of metal is aluminum.

10. A method as in claim 9, wherein the thickness of said second layer metal is less than about 3 microinches.

11. A method as in claim 8, wherein said second layer of metal is an aluminum alloy.

12. A method as in claim 11, wherein the thickness of said second layer of metal is less than about 3 microinches.

* * * * *